(12) United States Patent
Abel et al.

(10) Patent No.: US 12,020,923 B2
(45) Date of Patent: Jun. 25, 2024

(54) LOW-κ ALD GAP-FILL METHODS AND MATERIAL

(71) Applicant: Lam Research Corporation, Fremont, CA (US)

(72) Inventors: Joseph R. Abel, West Linn, OR (US); Douglas Walter Agnew, La Jolla, CA (US); Adrien Lavoie, Newberg, OR (US); Ian John Curtin, Minneapolis, MN (US); Purushottam Kumar, Hillsboro, OR (US)

(73) Assignee: Lam Research Corporation, Fremont, CA (US)

( * ) Notice: Subject to any disclaimer, the term of this patent is extended or adjusted under 35 U.S.C. 154(b) by 443 days.

(21) Appl. No.: 17/276,454

(22) PCT Filed: Sep. 20, 2019

(86) PCT No.: PCT/US2019/052215
§ 371 (c)(1),
(2) Date: Mar. 15, 2021

(87) PCT Pub. No.: WO2020/061491
PCT Pub. Date: Mar. 26, 2020

(65) Prior Publication Data
US 2022/0037146 A1  Feb. 3, 2022

Related U.S. Application Data
(60) Provisional application No. 62/734,635, filed on Sep. 21, 2018.

(51) Int. Cl.
*H01L 21/02*   (2006.01)
*C23C 16/30*   (2006.01)
(Continued)

(52) U.S. Cl.
CPC ........ *H01L 21/0228* (2013.01); *C23C 16/308* (2013.01); *C23C 16/325* (2013.01);
(Continued)

(58) Field of Classification Search
CPC ........... H01L 21/0228; H01L 21/02112; H01L 21/02126; H01L 21/02131; H01L 21/0214;
(Continued)

(56) References Cited

U.S. PATENT DOCUMENTS

2006/0046519 A1   3/2006  Tsuji et al.
2007/0042573 A1   2/2007  Kim et al.
(Continued)

FOREIGN PATENT DOCUMENTS

CN   112753090     5/2021
JP   2001118843 A  4/2001
(Continued)

OTHER PUBLICATIONS

"International Application Serial No. PCT US2019 052215, International Preliminary Report on Patentability dated Apr. 1, 2021", 11 pgs.
(Continued)

*Primary Examiner* — Syed I Gheyas
(74) *Attorney, Agent, or Firm* — Schwegman Lundberg & Woessner, P.A.

(57) ABSTRACT

Various embodiments include methods to produce low dielectric-constant (low-k) films. In one embodiment, alternating ALD cycles and dopant materials are used to generate a new family of silicon low-k materials. Specifically, these materials were developed to fill high-aspect-ratio structures with re-entrant features. However, such films are also useful in blanket applications where conformal nanolaminates are applicable. Various embodiments also disclose SiOF as well
(Continued)

as SiOCF, SiONF, GeOCF, and GeOF. Analogous films may include halide derivatives with iodine and bromine (e.g., replace "F" with "I" or "Br"). Other methods, chemistries, and techniques are disclosed.

18 Claims, 11 Drawing Sheets

(51) Int. Cl.

|  |  |
|---|---|
| *C23C 16/32* | (2006.01) |
| *C23C 16/40* | (2006.01) |
| *C23C 16/455* | (2006.01) |
| *C23C 16/56* | (2006.01) |

(52) U.S. Cl.
CPC ...... *C23C 16/401* (2013.01); *C23C 16/45527* (2013.01); *C23C 16/56* (2013.01); *H01L 21/02112* (2013.01); *H01L 21/02126* (2013.01); *H01L 21/02131* (2013.01); *H01L 21/0214* (2013.01); *H01L 21/02211* (2013.01)

(58) Field of Classification Search
CPC ............. H01L 21/02211; C23C 16/308; C23C 16/325; C23C 16/401; C23C 16/56; C23C 16/45527
See application file for complete search history.

(56) References Cited

U.S. PATENT DOCUMENTS

| 2011/0159673 | A1 | 6/2011 | Hanawa et al. |
| 2013/0115763 | A1 | 5/2013 | Takamure et al. |
| 2018/0204732 | A1* | 7/2018 | Kamakura ............ H01L 23/532 |

FOREIGN PATENT DOCUMENTS

| JP | 2022501822 | | 1/2022 |
| JP | 7433302 | B2 | 2/2024 |
| KR | 100652427 | B1 | 11/2006 |
| KR | 20130049752 | A | 5/2013 |
| KR | 20180038473 | A | 4/2018 |
| TW | 200941585 | | 10/2009 |
| TW | 201214524 | | 4/2012 |
| WO | WO-2011123369 | A1 | 10/2011 |
| WO | WO-2017046921 | A1 | 3/2017 |

OTHER PUBLICATIONS

International Application Serial No. PCT/US2019/052215, International Search Report dated Jan. 9, 2020, 3 pgs.
International Application Serial No. PCT/US2019/052215, Written Opinion dated Jan. 9, 2020, 9 pgs.
"Singapore Application Serial No. 11202102842U, Written Opinion dated Oct. 24, 2022", 7 pgs.
"Singapore Application Serial No. 11202102842U, Response filed Mar. 24, 2023 to Written Opinion dated Oct. 24, 2022", w English claims, 16 pgs.
"Taiwanese Application Serial No. 108134203, Office Action dated Jun. 13, 2023", w English Translation, 28 pgs.
Japanese Application Serial No. 2021-515484, Notification of Reasons for Rejection dated Sep. 5, 2023, with English Translation, 8 pgs.
Japanese Application Serial No. 2021-515484, Response filed Dec. 5, 2023 to Notification of Reasons for Rejection dated Sep. 5, 2023, w/ current English claims, 13 pgs.
Taiwanese Application Serial No. 108134203, Response filed Nov. 8, 2023 to Office Action dated Jun. 13, 2023, w/ English Claims, 3 pgs.
Korean Application Serial No. 10-2021-7011742, Notice of Preliminary Refusal mailed Feb. 6, 2024, w/ English Translation, 20 pgs.
"Taiwanese Application Serial No. 108134203, Decision of Rejection mailed Jan. 31, 2024", w Machine English Translation, 10 pgs.

* cited by examiner

LOW-κ ALD GAP-FILL METHODS AND MATERIAL

CLAIM OF PRIORITY

This patent application is a U.S. National-Phase Filing under 35 U.S.C. § 371 from International Application No. PCT/US2019/052215, filed on 20 Sep. 2019, and published as WO 2020/061491 A1 on 26 Mar. 2020, which claims priority to U.S. Provisional Application Ser. No. 62/734,635, entitled, "LOW-K ALD GAP-FILL METHODS AND MATERIAL," filed 21 Sep. 2018; the disclosure of each of which is incorporated herein by reference in its entirety.

TECHNICAL FIELD

The subject matter disclosed herein relates to preparing various types of films for use in semiconductor and allied industries. More specifically, the disclosed subject matter relates to forming low-κ (low dielectric constant) materials and gap-fill methods.

BACKGROUND

Resistance, capacitance (RC) scaling for semiconductor devices relies on the development of new films and materials with capabilities to deposit on and fill aggressive features. NAND, DRAM, PCRAM, and related memory and other devices rely on incorporation of silicon dioxide ($SiO_2$) for common dielectric devices. A high-quality bulk $SiO_2$ film has a dielectric constant, κ, of κ=4.0. Similarly, low-κ materials such as silicon oxycarbide (SiOC) are capable of achieving similar κ-values as disclosed herein.

The information described in this section is provided to offer the skilled artisan a context for the following disclosed subject matter and should not be considered as admitted prior art.

DETAILED DESCRIPTION

Figure 1:
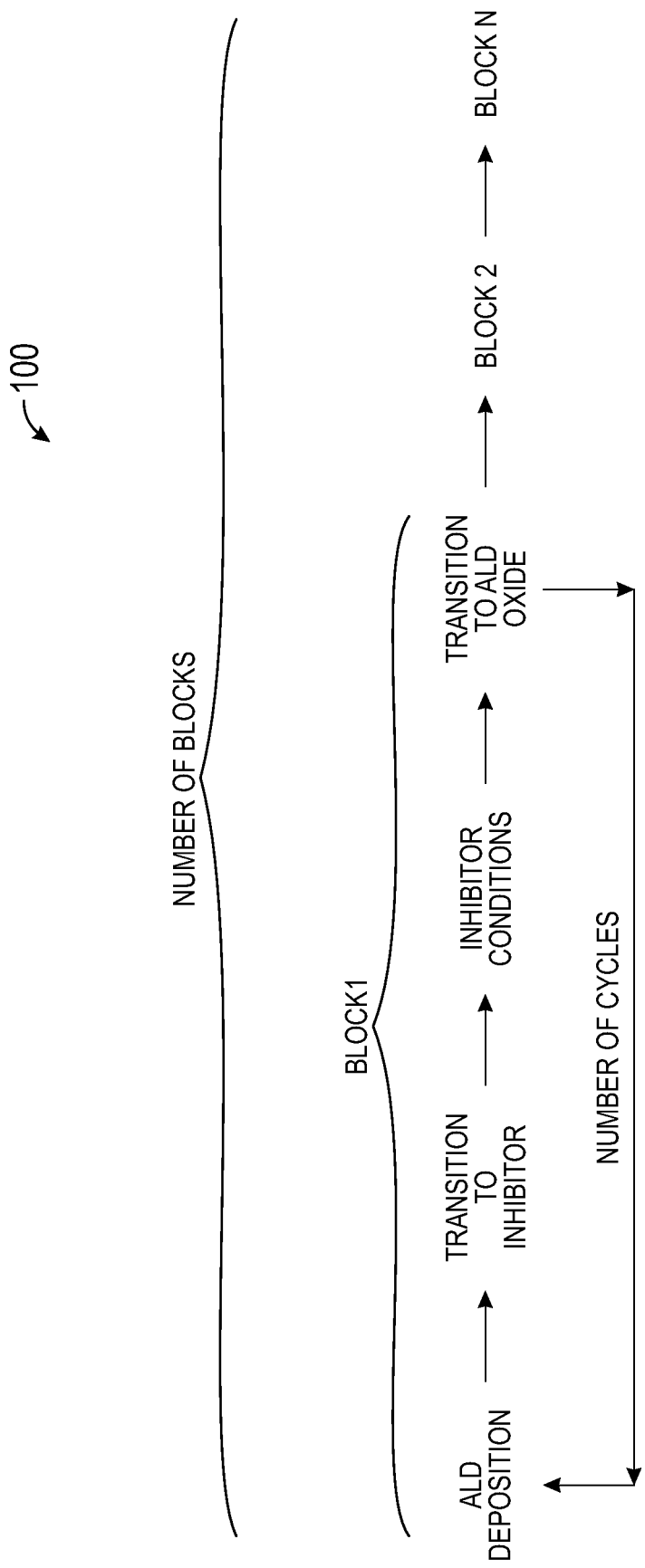
FIG. 1 shows process methods for the nanolaminate doping of silicon oxide films ($SiO_x$) films with fluorine-doped silicon oxide (SiOF, also known as fluorosilicate glass), or other halides for various embodiments of producing the low-κ film disclosed herein.

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well known process steps or structures have not been described in detail so as not to obscure the disclosed subject matter.

The disclosed subject matter discloses process methods that employ alternating atomic-layer deposition (ALD) cycles and dopant materials to generate a new family of silicon-based low-κ materials. In various embodiments, the dielectric constant, k, may be in a range of about 3.2 to about 3.4. Specifically, these materials were developed to fill high-aspect-ratio structures with re-entrant features. The processes disclosed herein can produce void-free or substantially void-free fills in high-aspect ratio features. However, these films can also be used for blanket-film applications where conformal nanolaminates are applicable. The disclosed subject matter includes, for example, fluorine-doped silicon oxide SiOF, as well as proposed routes to, for example, carbonofluoridoylsilicon (SiOCF), fluorinated silicon oxynitride (SiONF), carbonofluoridoylgermanium (GeOCF), and fluorine-doped germainum oxide (GeOF) materials. Analogous films to these films may also include, instead of or in addition to, halide derivatives with iodine and bromine (e.g., replace the F of the aforementioned materials with I or Br).

For gap-fill applications, these materials are applicable for, for example, NAND gap-fill (e.g., slit and pillar or hole) including 3D void-free gap filling of geometrically complex integrated circuit structures including 3D NAND word-lines, DRAM shallow-trench isolation (STI), logic STI, PCRAM STI, MRAM, and logic pre-metal dielectric (PMD). These materials and methods may also be employed for tandem deposition and gap-fill of horizontal and vertical device gap-fill (e.g., similar to interlayer capacitor stacks in between NAND word-lines and other devices). Fluorine, or another halide, may vary in density from about $1 \times 10^{18}$ atoms per cm$^3$ to about $1 \times 10^{21}$ atoms per cm$^3$ within an $SiO_x$ matrix.

The gap-fill process described herein is also an ALD process by modulating deposited film thicknesses, layer-by-layer, using for example, fluorine as a dopant. Therefore, in various embodiments, the ALD process includes a film deposition layer, fluorine doping, followed by another film deposition layer, and so on as needed for a given process. In various embodiments, each layer can be from, for example, about 7 Å to about 50 Å up to 100 Å or more. The number of iterations can vary by device type and may comprise up to hundreds of layers or more. Therefore, two variables, in addition to others disclosed herein, that can be varied include, for example, a level of fluorine (or other dopant type) doping and the type and thickness of deposited dielectric layers.

Further, a fluorine-dopant profile can be gradient or non-gradient, and in a z-direction or in a lateral direction. Consequently, if needed, gradients in dopant profile can be created in any direction. In various embodiments, incorporation of fluorine (or iodine (I) or bromine (Br) as noted above) is controlled as noted in the various figures included as a part of this disclosure.

In some instances, lowering a halide content of the films may be used. Methods of lowering a halide content of the films include, for example, either intermediate or post treatment: high processing temperature or temperatures, hydrogen treatment (+/−plasma), $H_2/O_2$ mixtures, and/or ultraviolet (UV) or vacuum ultraviolet (VUV) treatment. Deposition of these materials has been demonstrated with, for example, capacitively-coupled plasma (CCP) ALD processing at 13.56 MHz. However, other frequencies may also be applied (e.g., 400 Khz, 27 MHz, or 60 MHz). Additional activation methods including inductively-coupled plasma (ICP), VUV, and hot-wire radicals may also be applied.

Generally, with other factors being substantially constant, as the frequency is increased, the dielectric constant, κ, decreases. In various embodiments, power ranges can be from about 100 watts (or less) to about 6000 watts (or more). Increased power tends to increase the densification of a produced film.

SiOF films have been produced with deposition temperatures of from about 200° C. to about 550° C. In other embodiments, the SiOF films are produced at temperatures between about 0° C. to about 700° C., which is at least partially dependent on the selection of a silicon precursor. Also, the temperature can be used to control film density. For example, in one embodiment, ALD films produced at 0° C. have low density, while ALD films produced at 700° C. have a higher density.

In various embodiments, the following precursors and related analogs may be used: bistertbutylaminosilane (BT-BAS), trisdimethylaminosilane (3DMAS), trisdimethyaminosilane (TDMAS), bisdiethyaminosilane (BDEAS), diisopropylaminosilane (DIPAS), silylenes, silyl halides (e.g., F, Br, I), and so on as recognizable to a person of ordinary skill in the art based upon reading and understanding the disclosure provided herein.

A family of SiOF films has been developed with a novel doping strategy. The materials are deposited with intermittent fluorine precursor dosing in between ALD $SiO_2$ layers as described in more detail below. In one embodiment, a fluorine precursor includes nitrogen trifluoride ($NF_3$). However, various embodiments include other precursors including common gases that are used in dielectric-material dry etch and mixtures thereof (e.g., tetrafluoroethylene ($C_2F_4$), tetrafluoromethane ($CF_4$), chlorine ($Cl_2$), fluorine ($F_2$), xenon difluoride ($XeF_2$), xenon tetrafluoride ($XeF_4$), carbonyl fluoride ($COF_2$), sulfur hexafluoride ($SF_6$), trichlorofluoromethane ($CFCl_3$), trifluoromethane ($CHF_3$), trichlorofluoromethane ($CCl_3F$), boron trifluoride ($BF_3$), boron trichloride ($BCl_3$), tetrachloromethane ($CCl_4$), dichlorodifluoromethane ($CCl_2F_2$), etc.).

With reference now to FIG. 1, process methods 100 for the nanolaminate doping of silicon oxide films ($SiO_x$) films with fluorine-doped silicon oxide (SiOF, also known as fluorosilicate glass), or other halides for various embodiments of producing the low-κ film disclosed herein are shown. The process methods 100 therefore provide a high-level overview wherein the methods are described in more detail below with regard to general and specific exemplary embodiments. For example, in preparing a first block of material, an initial ALD is performed (e.g., an ALD-formed oxide block during an ALD deposition), followed by a transition to an inhibitor (e.g., purging ALD deposition gases by inputting one or more gases into a reaction chamber while outflowing one or more other gases from the reaction chamber) at stated inhibitor conditions (e.g., temperatures, pressures, volumetric flow rates, etc.), and then transition back to an ALD deposition (e.g., a transition back to an ALD-formed oxide). Each of these operations may be repeated for a given or predetermined number of cycles. As will be understandable to a person of ordinary skill in the art based on upon reading and understanding the disclosed subject matter provided herein, various recipe and process conditions, as well as a number of cycles for a given operation, are at least partially a function of a shape of a given feature. (e.g., dependent on a number and location of pinch points, re-entrant features, bends within a structure, etc.). Block 2 through Block N may repeat at least a portion of the operations of Block 1.

Figure 2A:
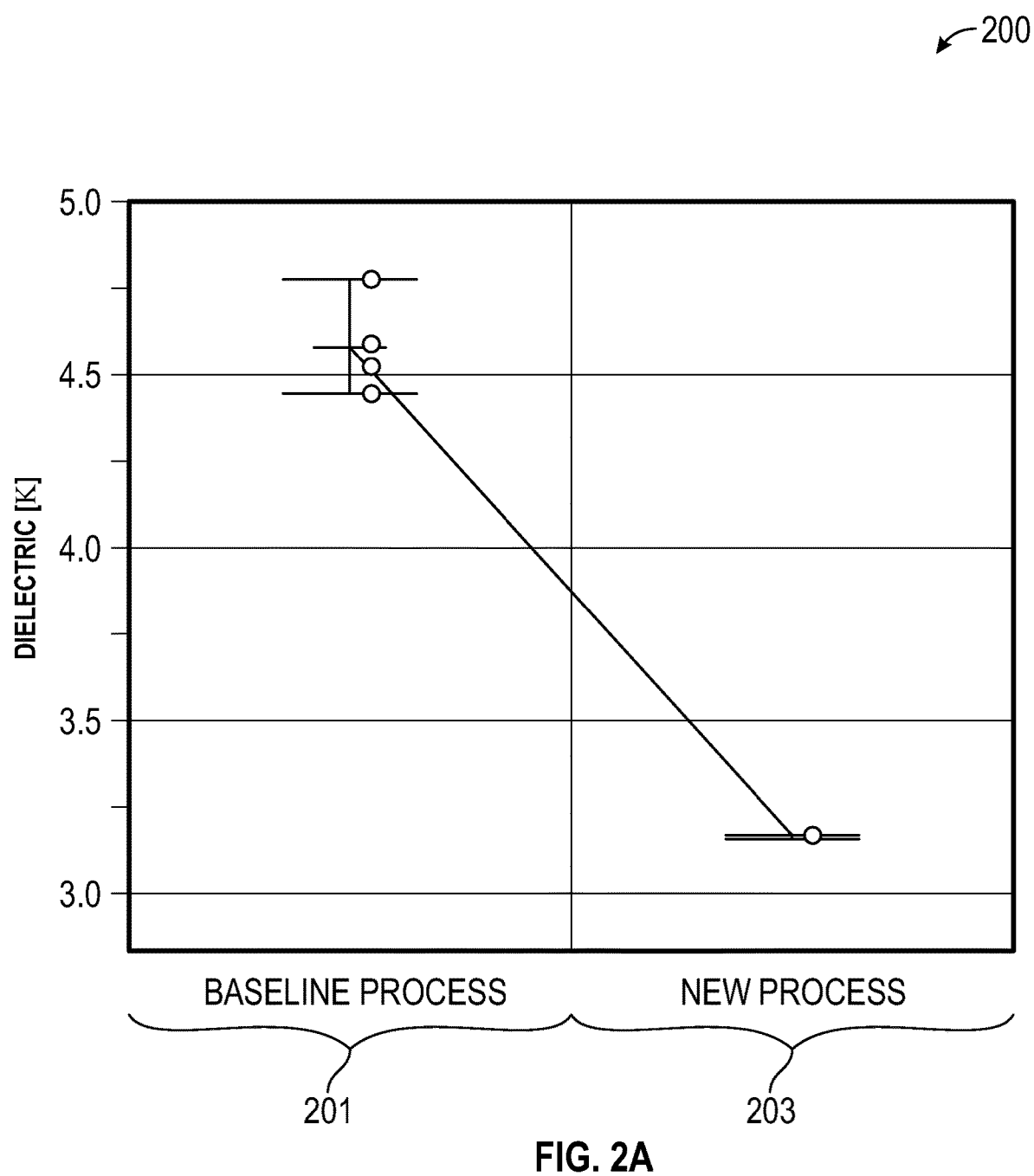
FIGS. 2A-2C show exemplary embodiments of 200° C. phase-change, random-access memory (PCRAM) blanket tests comparing a baseline process to the new process of the disclosed subject matter for dielectric constant (producing a lower-κ film), breakdown field-strength (having a breakdown voltage, $V_{bd}$, that is greater than a film produced by a baseline process), and leakage current (at 2 MV less than $1 \times 10^{-9}$ A/cm$^2$), thereby showing that the low-κ film produced by techniques and methods disclosed herein has comparable or better electrical properties than standard atomic-layer deposition (ALD) oxides.
Figure 2B:
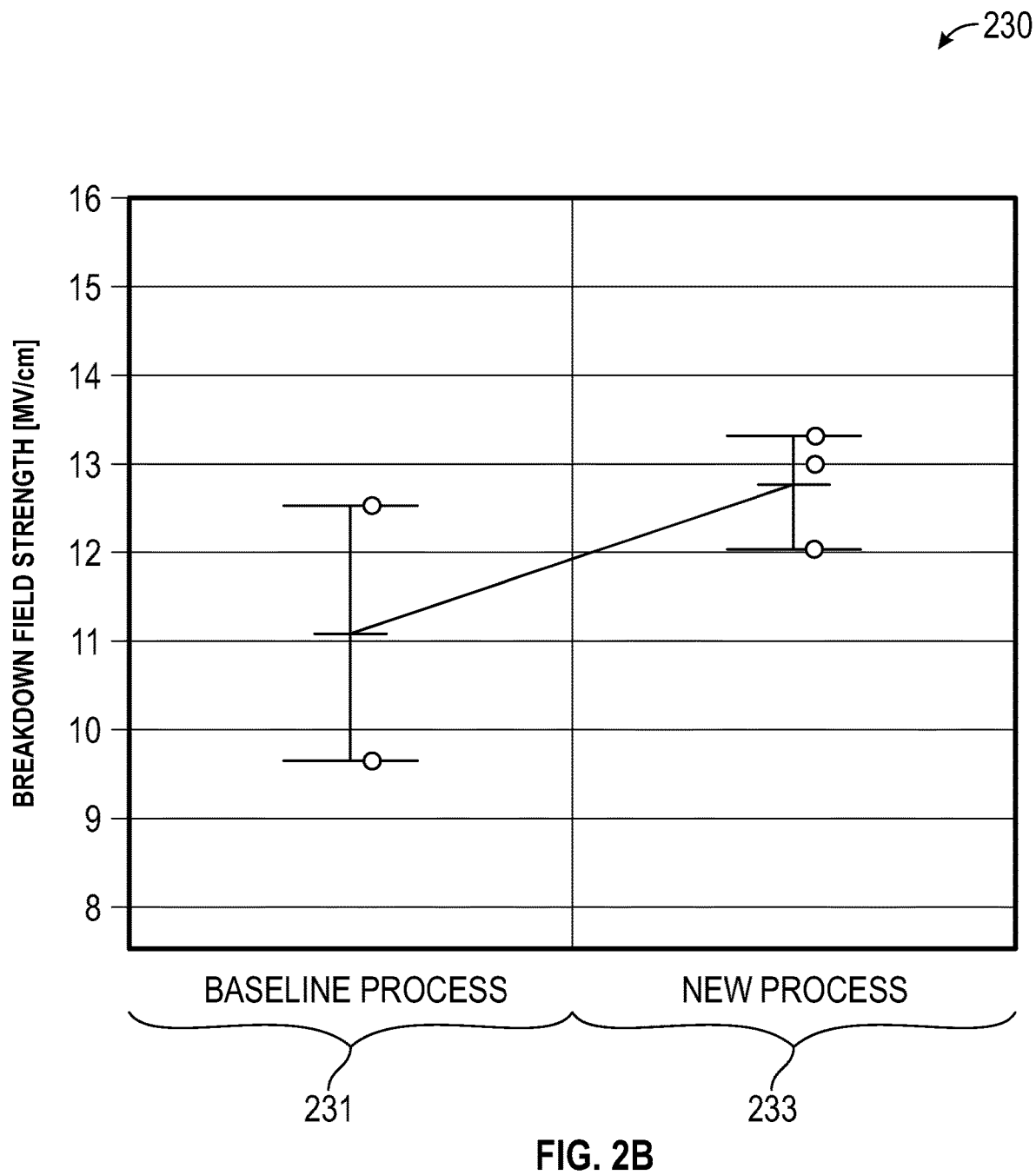
Figure 2C:
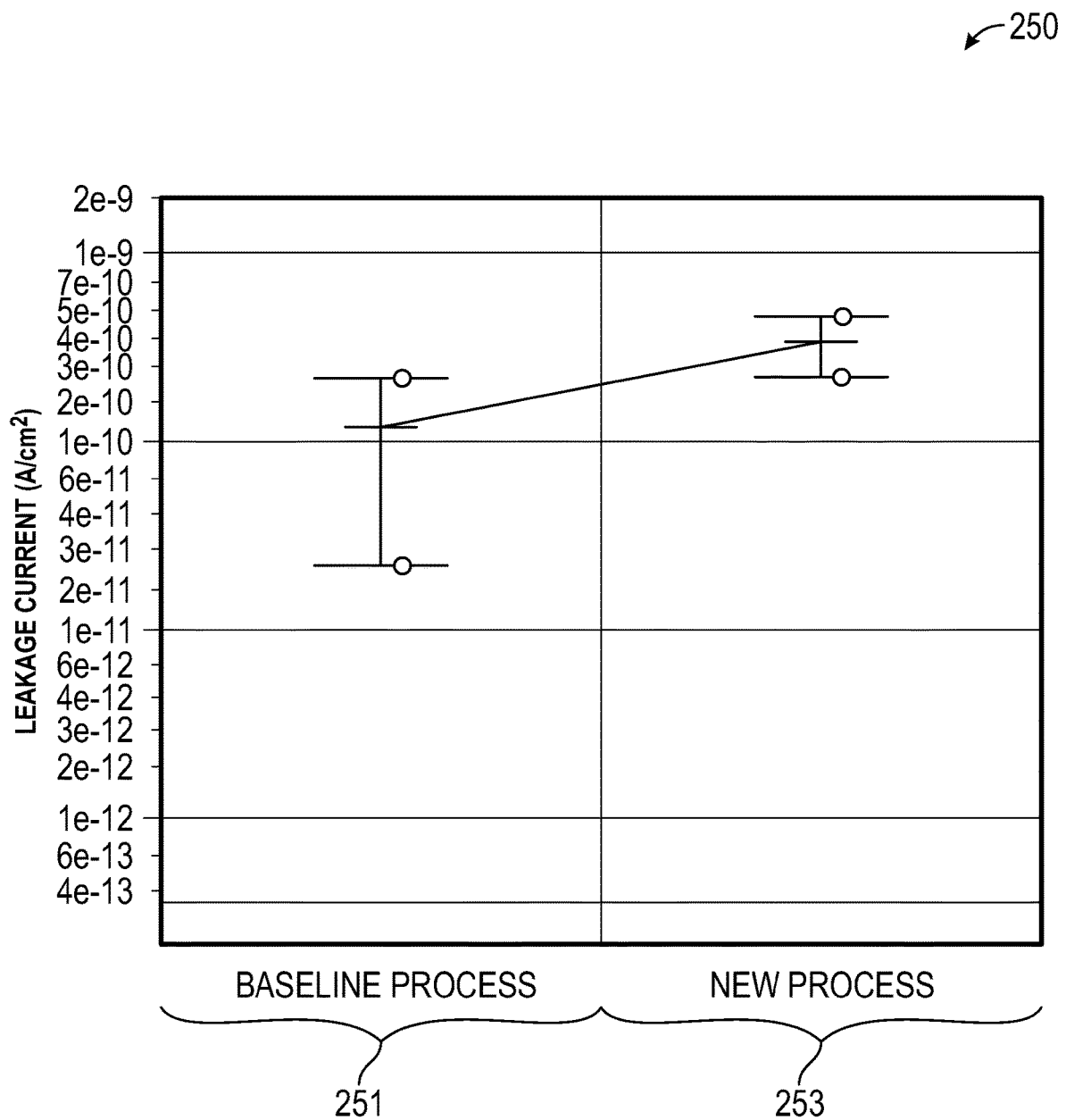

FIGS. 2A-2C show exemplary embodiments of 200° C. phase-change, random-access memory (PCRAM) blanket tests comparing a baseline process to the new process of the disclosed subject matter for dielectric constant (producing a lower-κ film), breakdown field-strength (having a breakdown voltage, $V_{bd}$, that is greater than a film produced by a baseline process), and leakage current (at 2 MV less than $1\times10^{-9}$ A/cm$^2$), thereby showing that the low-κ film produced by techniques and methods disclosed herein has comparable or better electrical properties than standard atomic-layer deposition (ALD) oxides.

For example, a graph 200 of FIG. 2A compares the dielectric constant, κ, of the baseline process 201 to the new process 203 as defined herein by the disclosed subject matter. As the graph 200 indicates, the new process 203 produces films with a significantly lower dielectric constant (e.g., the baseline process 201, producing films with an average κ of approximately 4.25, to the new process 203, producing films with an average κ of approximately 3.15). As further indicate by the graph 200, the error bars (e.g., the "spread" in produced film dielectric constants) are significantly smaller for the new process 203, thereby indicating a more constant and repeatable dielectric constant value for fabricated films produced by the new process 203.

A graph 230 of FIG. 2B compares a breakdown field-strength, in units of MV/cm, of the baseline process 231 to the new process 233 as defined herein by the disclosed subject matter. As the graph 230 indicates, the new process 233 produces films with a significantly higher breakdown field-strength (e.g., the baseline process 231, producing films with an average breakdown field-strength of approximately 11.2 MV/cm, to the new process 233, producing films with an average breakdown field-strength of approximately 12.6 MV/cm). As further indicate by the graph 230, the error bars are significantly smaller for the new process 233, thereby indicating a more constant and repeatable breakdown field-strength for fabricated films produced by the new process 233.

A graph 250 of FIG. 2C compares a leakage current, in units of A/cm$^2$, of the baseline process 251 to the new process 253 as defined herein by the disclosed subject matter. As the graph 250 indicates, the new process 253 produces films with a leakage current that is very slightly higher than, but comparable to, the baseline process 251

(albeit the ranges of leakage current overlap with one another), but with error bars that are significantly smaller for the new process 253, thereby indicating a more constant and repeatable leakage current value for fabricated films produced by the new process 253.

Figure 3A:
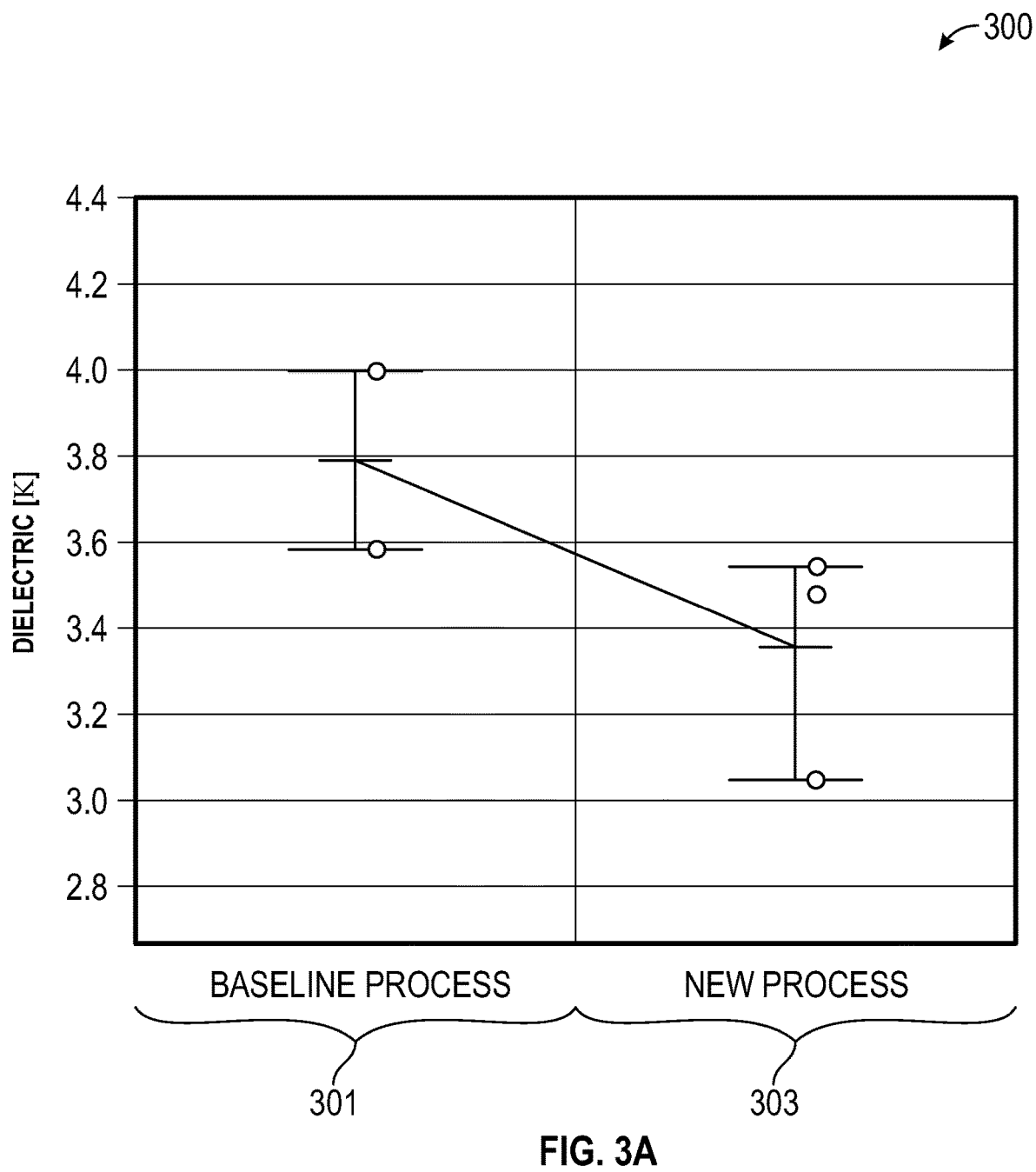
FIGS. 3A-3C show exemplary embodiments of 400° C. PCRAM blanket tests comparing a baseline process to the new process of the disclosed subject matter for dielectric constant (producing a lower-κ film), breakdown field-strength (having a breakdown voltage, $V_{bd}$, that is greater than a film produced by a baseline process), and leakage current (at 2 MV less than $1 \times 10^{-9}$ A/cm$^2$), thereby showing that the low-κ film produced by techniques and methods disclosed herein has comparable or better electrical properties than standard ALD oxides.
Figure 3B:
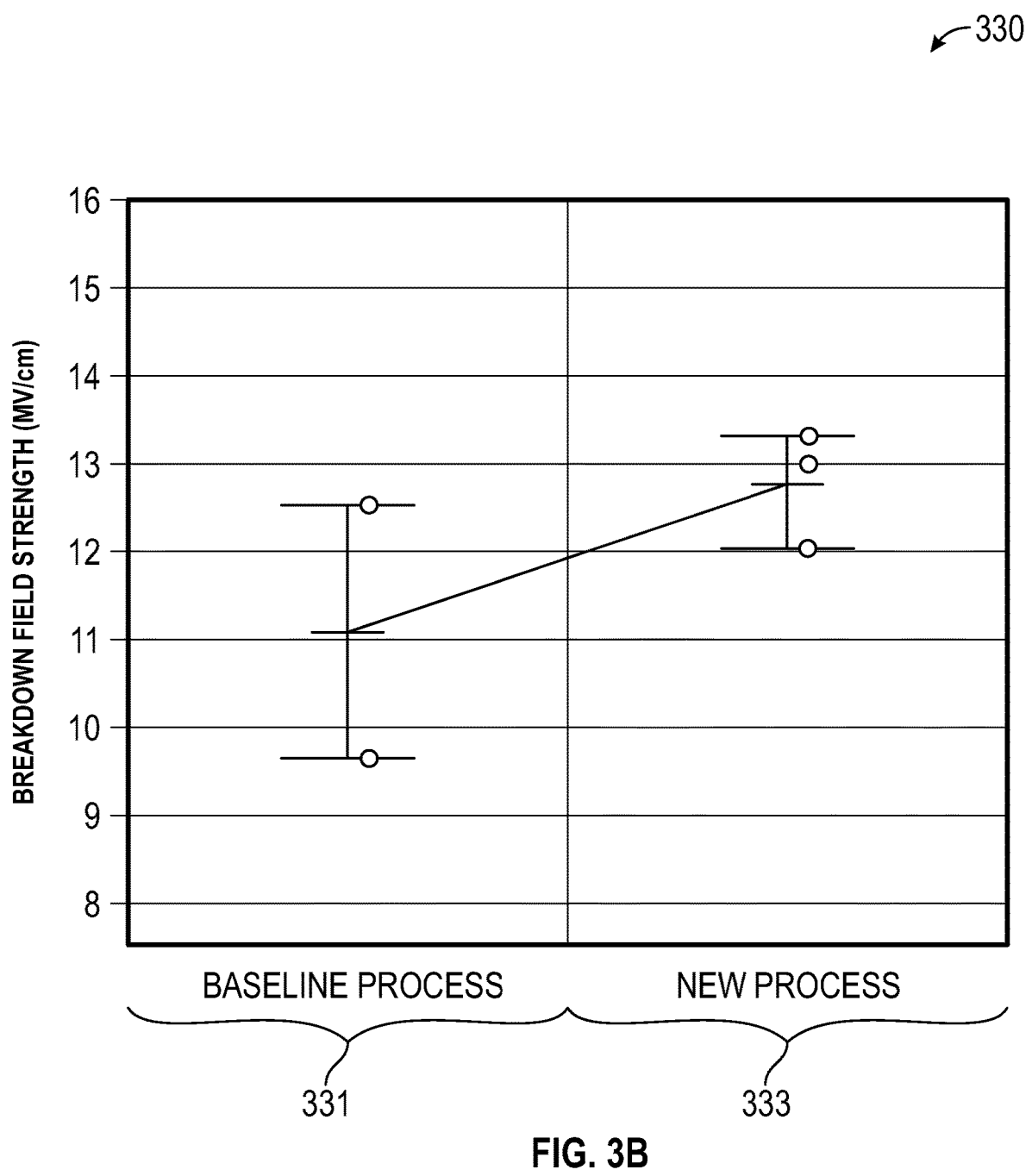
Figure 3C:
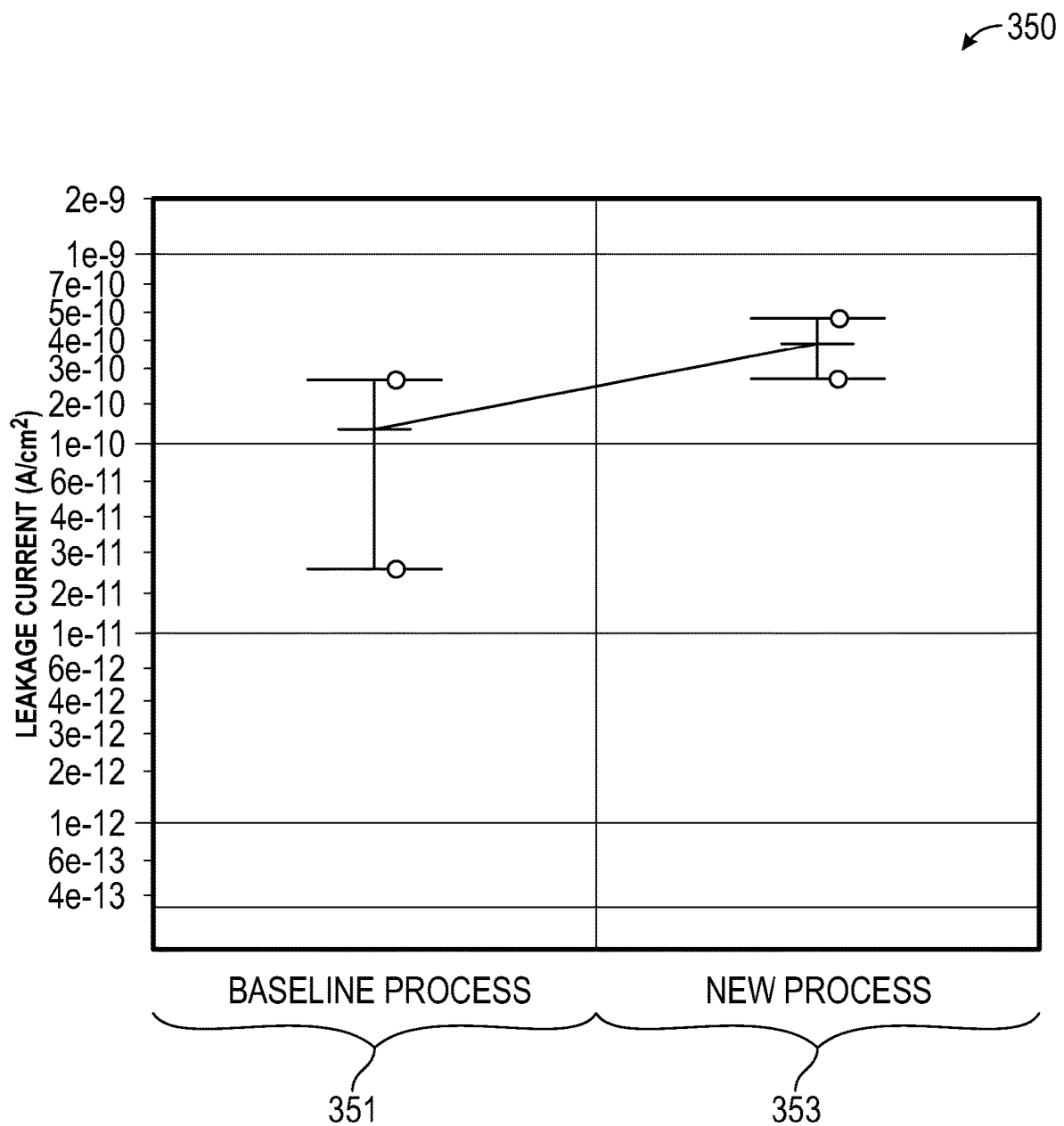

FIGS. 3A-3C show exemplary embodiments of 400° C. PCRAM blanket tests comparing a baseline process to the new process of the disclosed subject matter for dielectric constant (producing a lower-κ film), breakdown field-strength (having a breakdown voltage, $V_{bd}$, that is greater than a film produced by a baseline process), and leakage current (at 2 MV less than $1 \times 10^{-9}$ A/cm$^2$), thereby showing that the low-κ film produced by techniques and methods disclosed herein has comparable or better electrical properties than standard ALD oxides.

For example, a graph 300 of FIG. 3A compares the dielectric constant, κ, of the baseline process 301 to the new process 303 as defined herein by the disclosed subject matter. As the graph 300 indicates, the new process 303 produces films with a significantly lower dielectric constant (e.g., the baseline process 301, producing films with an average κ of approximately 3.8, to the new process 303, producing films with an average κ of approximately 3.3). As further indicate by the graph 300, the range indicated by error bars are approximately the same for the new process 303 as compared with the baseline process 301.

A graph 330 of FIG. 3B compares a breakdown field-strength, in units of MV/cm, of the baseline process 331 to the new process 333 as defined herein by the disclosed subject matter. As the graph 330 indicates, the new process 333 produces films with a significantly higher breakdown field-strength (e.g., the baseline process 331, producing films with an average breakdown field-strength of approximately 11.2 MV/cm, to the new process 233, producing films with an average breakdown field-strength of approximately 12.7 MV/cm). As further indicate by the graph 330, the error bars are significantly smaller for the new process 333, thereby indicating a more constant and repeatable breakdown field-strength for fabricated films produced by the new process 333.

A graph 350 of FIG. 3C compares a leakage current, in units of A/cm$^2$, of the baseline process 351 to the new process 353 as defined herein by the disclosed subject matter. As the graph 350 indicates, the new process 353 produces films with a leakage current that is very slightly higher than, but comparable to, the baseline process 351 (albeit the ranges of leakage current overlap with one another), but with error bars that are significantly smaller for the new process 353, thereby indicating a more constant and repeatable leakage current value for fabricated films produced by the new process 353.

Figure 4:
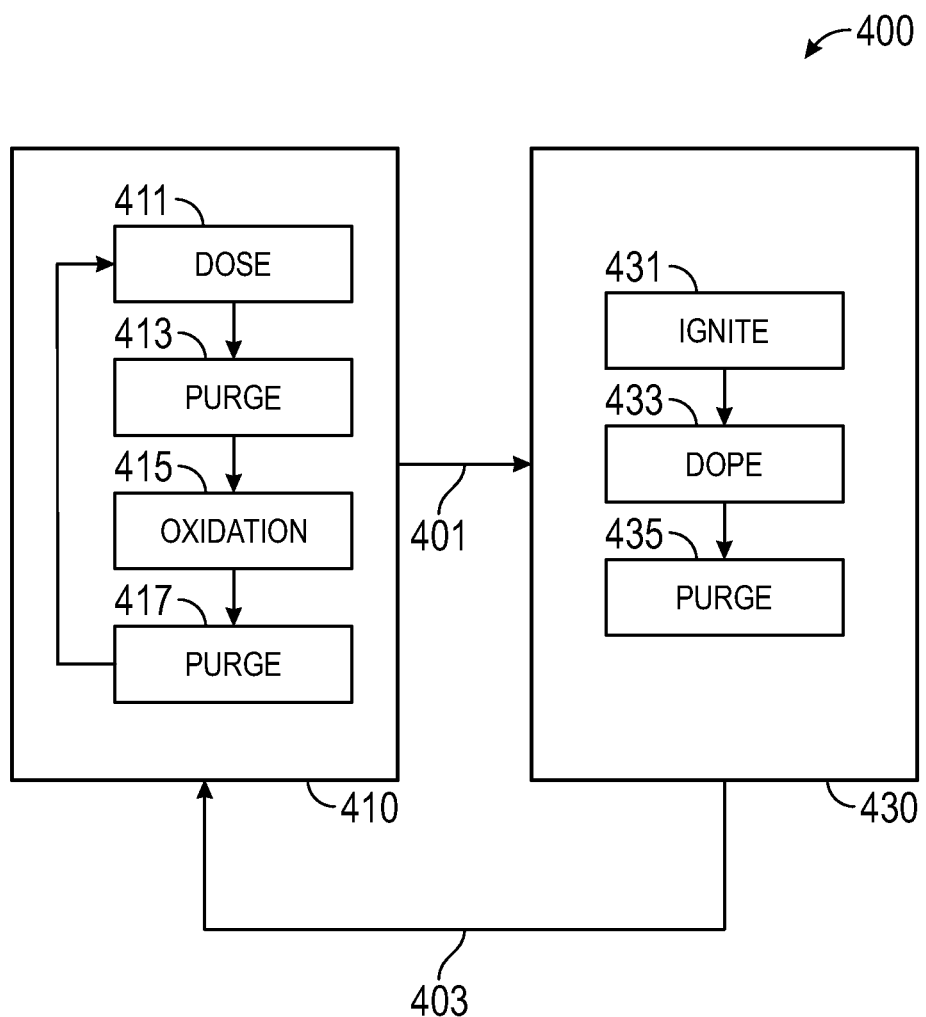
FIG. 4 shows an exemplary embodiment of a method of an ALD process flow incorporating a dopant process flow.

FIG. 4 shows an exemplary embodiment of a method 400 of an ALD process flow 410 incorporating a dopant process flow 430. Depending on a particular operation (including required film thicknesses and characteristics, gap-fill capabilities, aspect ratios of features, and other factors understandable to a person of ordinary skill in the art) the ALD process flow 410 may be repeated from 1 to 100 or more times (e.g., n=1 to n≥100 cycles). At least portions of the dopant process flow 430 may be incorporated within the ALD process flow 410 as needed during the "n" cycles.

In a specific exemplary embodiment, at a dose operation 411, a silane precursor gas is introduced to a substrate (e.g., a silicon wafer) in a reactor chamber and includes one or more of the following gases at or near the stated volumetric flow rates: argon (Ar) at about 1 standard liter per minute (slpm) to about 20 slpm, nitrogen ($N_2$) at about 0 slpm to about 30 slpm, and hydrogen ($H_2$) at about 0 slpm to about 5 slpm. A pressure within the chamber may be about 0.6 Torr to about 10 Torr and a temperature within the chamber may be at about 150° C. to about 550° C. As noted above, a change in the temperature can be used to control film density for a given operation. The stated chamber pressures and temperatures may either substantially be constant or may be variable within the stated ranges of pressure and temperature for the entirety of the exemplary embodiment of the method 400.

During a purge operation 413, byproducts and excess reactant gases are purged from the reaction chamber. The gases include Ar at about 1 slpm to about 20 slpm, $N_2$ at about 0 slpm to about 30 slpm, $H_2$ at about 0 slpm to about 5 slpm, oxygen ($O_2$) at about 0.5 slpm to about 5 slpm, and nitrous oxide ($N_2O$) at about 0.5 slpm to about 5 slpm.

In an oxidation operation 415, a surface of the substrate is oxidized and cleaned with an RF plasma. The oxidation operation 415 includes one or more of the following gases at or near the stated flow rates: Ar at about 1 slpm to about 20 slpm, $N_2$ at about 0 slpm to about 30 slpm, $H_2$ at about 0 slpm to about 5 slpm, $O_2$ at about 0.5 slpm to about 5 slpm, and $N_2O$ at about 0.5 slpm to about 5 slpm. The RF power may be in a range of about 500 W to about 5000 W. A frequency of the RF power may be one or more of the aforementioned frequencies or another frequency at which the reactor chamber is configured to operate.

In a second purge operation 417, residual oxidants are purged from the reaction chamber. The gases include Ar at about 1 slpm to about 20 slpm, $N_2$ at about 0 slpm to about 30 slpm, $H_2$ at about 0 slpm to about 5 slpm, $O_2$ at about 0.5 slpm to about 5 slpm, and $N_2O$ at about 0.5 slpm to about 5 slpm. After completion of the second purge operation 417, the ALD process flow 410 sequence may begin again at the dose operation 411. As noted above, the number of cycles through the ALD process flow 410 may be from n=1 time to n=100 times or more depending on a given operation and desired film characteristics.

The dopant process flow 430 may be introduced at operation 401 at one or more appropriate points in the ALD process flow 410 for a given process and the dopant process flow 430 may return at operation 403 back to the ALD process flow 410. The dopant process flow 430 is shown to include an ignite operation 431, a dope operation 433, and a purge operation 435. As is noted above with reference to the ALD process flow 410, a pressure within the chamber may be about 0.6 to about 10 Torr and a temperature within the chamber may be at about 150° C. to about 550° C. The stated chamber pressures and temperatures may either substantially be constant within the reaction chamber or within the stated ranges of pressure and temperature for the entirety of the exemplary embodiment of the method 400.

The ignite operation 431 includes one or more of the following gases at or near the stated flow rates: Ar at about 1 slpm to about 20 slpm, $N_2$ at about 0 slpm to about 30 slpm, $H_2$ at about 0 slpm to about 5 slpm, $O_2$ at about 0.5 slpm to about 5 slpm, and nitrogen trifluoride ($NF_3$) at about 5 standard cubic centimeters per minute (sccm) to about 2500 sccm. The RF power may be in a range of about 500 W to about 5000 W with either, for example, a single RF power or dual RF power. A frequency of the RF power may be one or more of the aforementioned frequencies or another frequency at which the reactor chamber is configured to operate.

The dope operation 433 includes one or more of the following gases at or near the stated flow rates: Ar at about 1 slpm to about 20 slpm, $N_2$ at about 0 slpm to about 30 slpm, $H_2$ at about 0 slpm to about 5 slpm, $O_2$ at about 0.5 slpm to about 5 slpm, and $NF_3$ at about 5 sccm to about 2500 sccm. The RF power may be in a range of about 500 W to about 5000 W with either, for example, a single RF power or dual RF power. A frequency of the RF power may be one or more of the aforementioned frequencies or another frequency at which the reactor chamber is configured to operate. A time period is from about 0.02 seconds to about 2.0 seconds.

In the purge operation 435, residual gases are purged from the reaction chamber. The gases include Ar at about 1 slpm to about 20 slpm, $N_2$ at about 0 slpm to about 30 slpm, $H_2$ at about 0 slpm to about 5 slpm, $O_2$ at about 0.5 slpm to about 5 slpm, and other residual gases. The RF power may be in a range of about 500 W to about 5000 W with either, for example, a single RF power or dual RF power. A frequency of the RF power may be one or more of the aforementioned frequencies or another frequency at which the reactor chamber is configured to operate.

Figure 5:
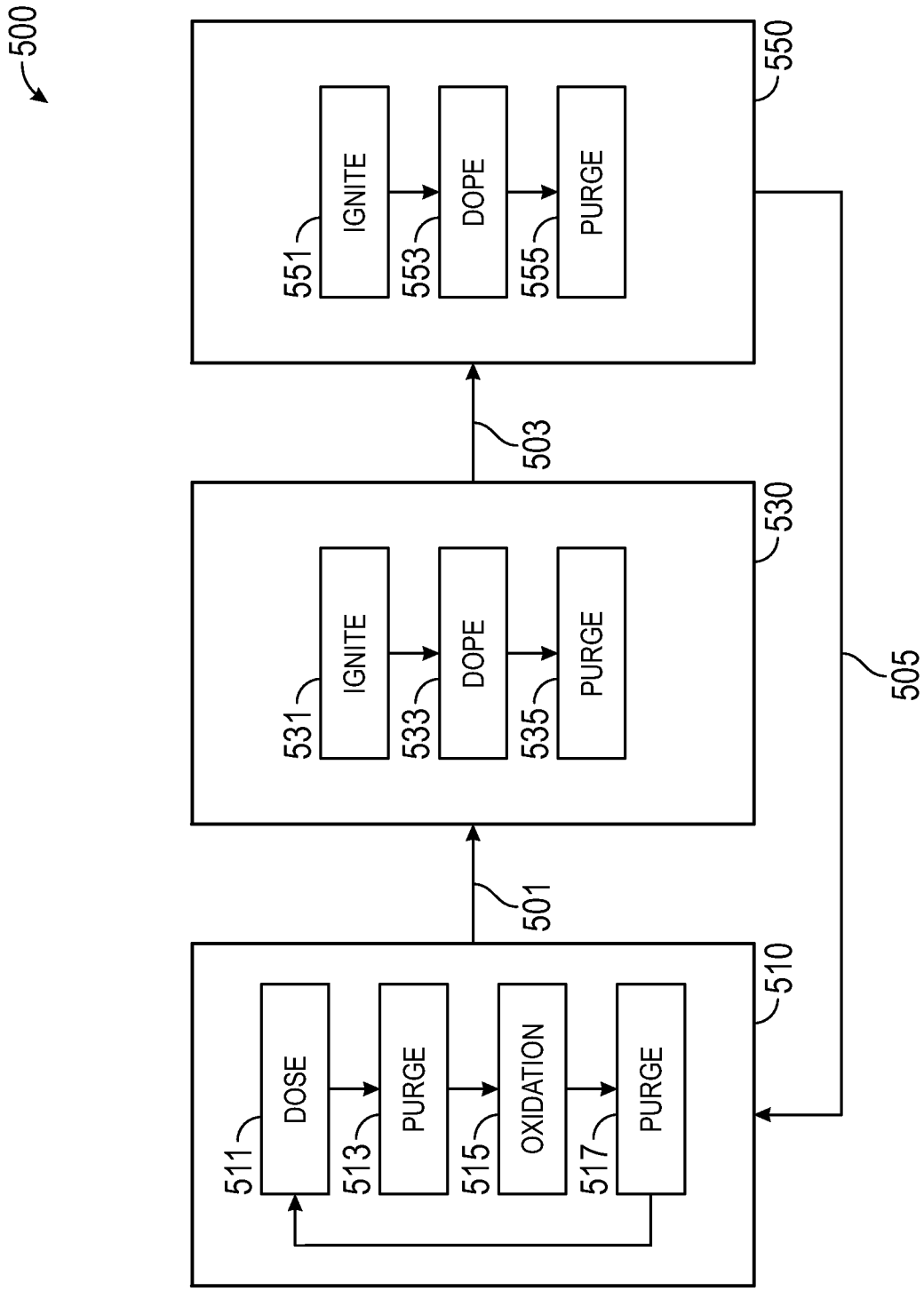
FIG. 5 shows an exemplary embodiment of a method of an ALD process flow incorporating a dopant process flow and an anneal process-control flow.

FIG. 5 shows an exemplary embodiment of a method 500 of an ALD process flow 510 incorporating a dopant process flow 530 and an anneal process-control flow 550. Depending on a particular operation (including required film thicknesses and characteristics, gap-fill capabilities, aspect ratios of features, and other factors understandable to a person of ordinary skill in the art) the ALD process flow 510 may be repeated from 1 to 100 or more times (e.g., n=1 to n≥100 cycles). At least portions of the dopant process flow 530 and the anneal process-control flow 550 may be incorporated within the ALD process flow 510 and within the method 500 in part or in their entireties as needed during the "n" cycles.

Further, although the dopant process flow 530 and the anneal process-control flow 550 are indicated in FIG. 5 as being in a certain order, no such order should be inferred. For example, one or more of the operations within the dopant process flow 530 may occur subsequent to one or more operations in the anneal process-control flow 550. For example, the dopant process flow 530 and the anneal process-control flow 550 operations can be switched depending on a desired doping control.

Referring again to the ALD process flow 510, in a specific exemplary embodiment, at a dose operation 511, a silane precursor gas is introduced to a substrate (e.g., a silicon wafer) in a reactor chamber and includes one or more of the following gases at or near the stated flow rates: Ar at about 1 slpm to about 10 slpm, $N_2$ at about 0 slpm to about 30 slpm, and $H_2$ at about 0 slpm to about 5 slpm. A pressure within the chamber may be about 0.6 Torr to about 10 Torr and a temperature within the chamber may be at about 150° C. to about 550° C. As noted above, a change in the temperature can be used to control film density for a given operation. The stated chamber pressures and temperatures may either substantially be constant or may be variable within the stated ranges of pressure and temperature for the entirety of the exemplary embodiment of the method 500.

During a purge operation 513, byproducts and excess reactant gases are purged from the reaction chamber. The gases include Ar at about 1 slpm to about 10 slpm, $N_2$ at about 0 slpm to about 30 slpm, $H_2$ at about 0 slpm to about 5 slpm, $O_2$ at about 0.5 slpm to about 5 slpm, and $N_2O$ at about 0.5 slpm to about 5 slpm.

In an oxidation operation 515, a surface of the substrate is oxidized and cleaned with an RF plasma. The oxidation operation 515 includes one or more of the following gases at or near the stated flow rates: Ar at about 1 slpm to about 20 slpm, $N_2$ at about 0 slpm to about 30 slpm, $H_2$ at about 0 slpm to about 5 slpm, $O_2$ at about 0.5 slpm to about 5 slpm, and $N_2O$ at about 0.5 slpm to about 5 slpm. The RF power may be in a range of about 500 W to about 5000 W. A frequency of the RF power may be one or more of the aforementioned frequencies or another frequency at which the reactor chamber is configured to operate.

In a second purge operation 517, residual oxidants are purged from the reaction chamber. The gases include Ar at about 1 slpm to about 20 slpm, $N_2$ at about 0 slpm to about 30 slpm, $H_2$ at about 0 slpm to about 5 slpm, $O_2$ at about 0.5 slpm to about 5 slpm, and $N_2O$ at about 0.5 slpm to about 5 slpm. After completion of the second purge operation 517, the ALD process flow 510 sequence may begin again at the dose operation 511. As noted above, the number of cycles through the ALD process flow 510 may be from n=1 time to n=100 times or more depending on a given operation and desired film characteristics.

The dopant process flow 530 may be introduced at operation 501 at one or more appropriate points in the ALD process flow 510 for a given process and the dopant process flow 530 may continue to all or parts of the anneal process-control flow 550. Also, as described above, although the dopant process flow 530 and the anneal process-control flow 550 are indicated in FIG. 5 as being in a certain order, no such order should be inferred. For example, one or more of the operations within the dopant process flow 530 may occur subsequent to one or more operations in the anneal process-control flow 550. For example, the dopant process flow 530 and the anneal process-control flow 550 operations can be switched depending on a desired doping control. Therefore, after one or more operations in either the dopant process flow 530 and the anneal process-control flow 550, operations within the method 500 may return back to the ALD process flow 510 at operation 505.

With continuing reference to the dopant process flow 530, an ignite operation 531, a dope operation 533, and a purge operation 535 are shown to be included within the dopant process flow 530. As is noted above with reference to the ALD process flow 510, a pressure within the chamber may be about 0.6 to about 10 Torr and a temperature within the chamber may be at about 150° C. to about 550° C. The stated chamber pressures and temperatures may either substantially be constant within the reaction chamber or within the stated ranges of pressure and temperature for the entirety of the exemplary embodiment of the method 500.

The ignite operation 531 includes one or more of the following gases at or near the stated flow rates: Ar at about 1 slpm to about 20 slpm, $N_2$ at about 0 slpm to about 30 slpm, $H_2$ at about 0 slpm to about 5 slpm, $O_2$ at about 0.5 slpm to about 5 slpm, and $NF_3$ at about 5 standard cubic centimeters per minute (sccm) to about 2500 sccm. The RF power may be in a range of about 500 W to about 5000 W with either, for example, a single RF power or dual RF power. A frequency of the RF power may be one or more of the aforementioned frequencies or another frequency at which the reactor chamber is configured to operate.

The dope operation 533 includes one or more of the following gases at or near the stated flow rates: Ar at about 1 slpm to about 20 slpm, $N_2$ at about 0 slpm to about 30 slpm, $H_2$ at about 0 slpm to about 5 slpm, $O_2$ at about 0.5 slpm to about 5 slpm, and $NF_3$ at about 5 sccm to about 2500 sccm. The RF power may be in a range of about 500 W to about 5000 W with either, for example, a single RF power or dual RF power. A frequency of the RF power may be one or more of the aforementioned frequencies or another frequency at which the reactor chamber is configured to operate. A time period is from about 0.02 seconds to about 2.0 seconds.

In the purge operation 535, residual gases are purged from the reaction chamber. The gases include Ar at about 1 slpm to about 20 slpm, $N_2$ at about 0 slpm to about 30 slpm, $H_2$ at about 0 slpm to about 5 slpm, $O_2$ at about 0.5 slpm to about 5 slpm, and other residual gases. The RF power may be in a range of about 500 W to about 5000 W. A frequency of the RF power may be one or more of the aforementioned frequencies or another frequency at which the reactor chamber is configured to operate.

The anneal process-control flow 550 is shown to include an ignite operation 551, a dope operation 553, and a purge operation 555. As is noted above with reference to the ALD process flow 510, a pressure within the chamber may be about 0.6 to about 10 Torr and a temperature within the chamber may be at about 150° C. to about 550° C. The stated chamber pressures and temperatures may either substantially be constant within the reaction chamber or within the stated ranges of pressure and temperature for the entirety of the exemplary embodiment of the method 500.

The ignite operation 551 includes one or more of the following gases at or near the stated flow rates: Ar at about 1 slpm to about 20 slpm, $N_2$ at about 0 slpm to about 30 slpm, $H_2$ at about 0 slpm to about 5 slpm, and $O_2$ at about 0.5 slpm to about 5 slpm. The RF power may be in a range of about 500 W to about 5000 W with either, for example, a single RF power or dual RF power. A frequency of the RF power may be one or more of the aforementioned frequencies or another frequency at which the reactor chamber is configured to operate.

The dope operation 553 includes one or more of the following gases at or near the stated flow rates: Ar at about 1 slpm to about 20 slpm, $N_2$ at about 0 slpm to about 30 slpm, $H_2$ at about 0 slpm to about 5 slpm, and $O_2$ at about 0.5 slpm to about 5 slpm. The RF power may be in a range of about 500 W to about 5000 W with either, for example, a single RF power or dual RF power. A frequency of the RF power may be one or more of the aforementioned frequencies or another frequency at which the reactor chamber is configured to operate. A time period is from about 0.02 seconds to about 2.0 seconds.

In the purge operation 555, residual gases are purged from the reaction chamber. The gases include Ar at about 1 slpm to about 20 slpm, $N_2$ at about 0 slpm to about 30 slpm, $H_2$ at about 0 slpm to about 5 slpm, $O_2$ at about 0.5 slpm to about 5 slpm, and other residual gases. The RF power may be in a range of about 500 W to about 5000 W. A frequency of the RF power may be one or more of the aforementioned frequencies or another frequency at which the reactor chamber is configured to operate.

Figure 6:
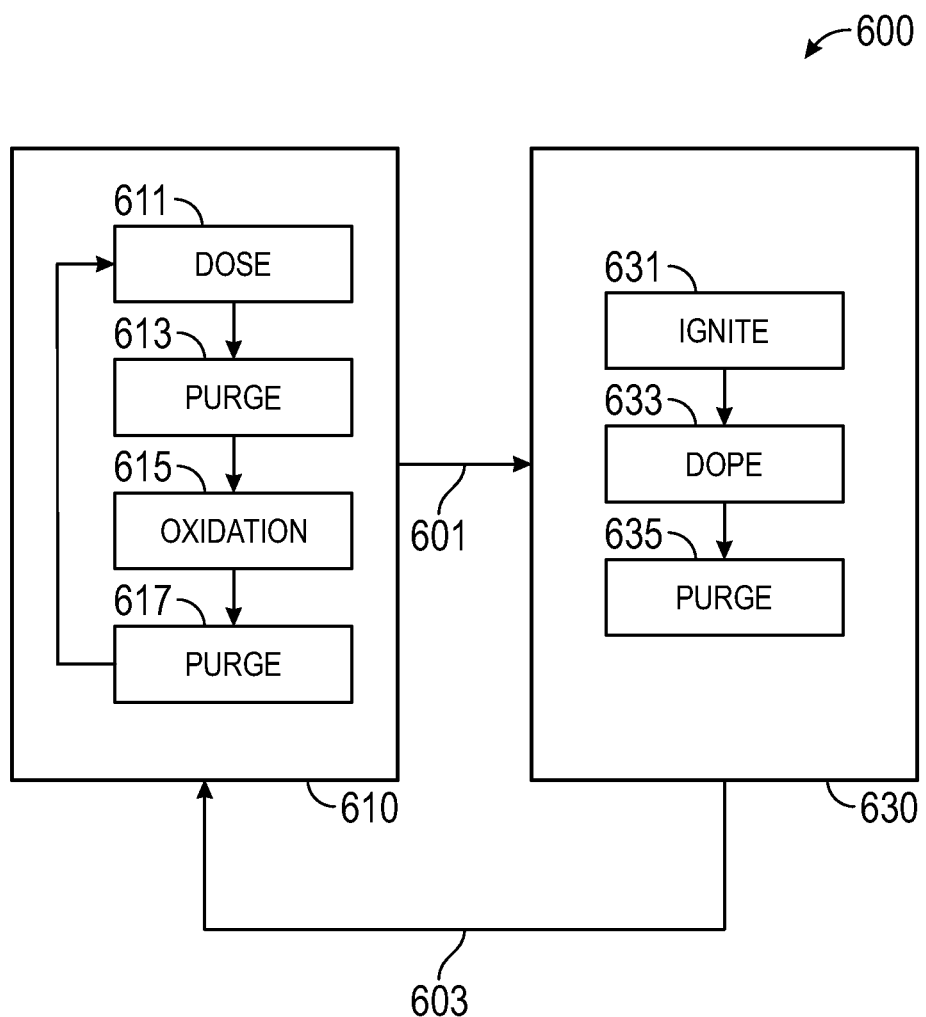
FIG. 6 shows an exemplary embodiment of a method of an ALD process flow for low aspect-ratio (low AR) features and incorporating a dopant process flow.

FIG. 6 shows an exemplary embodiment of a method 600 of an ALD process flow for low aspect-ratio (low AR) features and incorporating a dopant process flow. The exemplary embodiment of the method 600 includes an ALD process flow 610 and a dopant process flow 630. Depending on a particular operation (including required film thicknesses and characteristics, gap-fill capabilities, aspect ratios of features, and other factors understandable to a person of ordinary skill in the art) the ALD process flow 610 may be repeated from 1 to 5 or more times (e.g., n=1 to n≥5 cycles). The dopant process flow 630 may be incorporated within the ALD process flow 610 and within the method 600 in part or in its entirety as needed during the "n" cycles. Further, as is recognizable to a person of ordinary skill in the art, these gases, volumetric flow rates, pressures, and temperatures stated for the method 600 are for a specific exemplary embodiment and may be varied for a particular application.

With reference now to the ALD process flow 610, in a specific exemplary embodiment, at a dose operation 611, a silane precursor gas is introduced to a substrate (e.g., a silicon wafer) in a reactor chamber and includes one or more of the following gases at or near the stated flow rates: Ar at about 10 slpm and $N_2$ at about 10 slpm. A pressure within the chamber may be about 7 Torr and a temperature within the chamber may be at about 550° C.

During a purge operation 613, byproducts and excess reactant gases are purged from the reaction chamber. The gases include Ar at about 10 slpm, $N_2$ at about 10 slpm, $O_2$ at about 5 slpm, and $N_2O$ at about 5 slpm. A pressure within the chamber may be about 7 Torr and a temperature within the chamber may be at about 550° C.

In an oxidation operation 615, a surface of the substrate is oxidized and cleaned with an RF plasma. The oxidation operation 615 includes one or more of the following gases at or near the stated volumetric flow rates: Ar at about 10 slpm, $N_2$ at about 10 slpm, $O_2$ at about 5 slpm, and $N_2O$ at about 5 slpm. A pressure within the chamber may be about 7 Torr and a temperature within the chamber may be at about 550° C. The RF power may be about 5000 W. A frequency of the RF power may be one or more of the aforementioned frequencies or another frequency at which the reactor chamber is configured to operate.

In a second purge operation 617, residual oxidants are purged from the reaction chamber. The gases include Ar at about 10 slpm, $N_2$ at about 10 slpm, $O_2$ at about 5 slpm, and $N_2O$ at about 5 slpm. A pressure within the chamber may be about 7 Torr and a temperature within the chamber may be at about 550° C. After completion of the second purge operation 517, the ALD process flow 510 sequence may begin again at the dose operation 611. As noted above, the number of cycles through the ALD process flow 510 may be from n=1 time to n=5 times or more depending on a given operation and desired film characteristics.

The dopant process flow 630 may be introduced at operation 601 at one or more appropriate points in the ALD process flow 610 for a given process and the dopant process flow 630 may return at operation 603 back to the ALD process flow 610. The dopant process flow 630 is shown to include an ignite operation 631, a dope operation 633, and a purge operation 635. In this specific exemplary embodiment, a pressure within the chamber may be about 1 Torr and a temperature within the chamber may be at about 550° C. Further, as is recognizable to a person of ordinary skill in the art, listed gases, volumetric flow rates, pressures, and temperatures stated for the dopant process flow 630 are for a specific exemplary embodiment and may be varied for a particular application.

With continuing reference to the dopant process flow 630, the ignite operation 631 includes one or more of the following gases at or near the stated volumetric flow rates: Ar at about 2 slpm, $N_2$ at about 10 slpm, $O_2$ at about 1 slpm, and $NF_3$ at about 50 sccm. The RF power may be at about 1500 W at a frequency of about 13.56 MHz and at about 750 W at a frequency of about 400 kHz.

The dope operation 633 includes one or more of the following gases at or near the stated volumetric flow rates: Ar at about 2 slpm, $N_2$ at about 10 slpm, $O_2$ at about 1 slpm, and $NF_3$ at about 50 sccm. The RF power may be at about 1500 W at a frequency of about 13.56 MHz and at about 750 W at a frequency of about 400 kHz. As is known to a person of ordinary skill in the art, a time period may be determined for a given doping operation.

In the purge operation 635, residual gases are purged from the reaction chamber. The gases include Ar 2 slpm, $N_2$ at 10 slpm, O₂ at about 1 slpm, NF₃ at about 50 sccm, and other residual gases. The RF power may be at about 1500 W at a frequency of about 13.56 MHz and at about 750 W at a frequency of about 400 kHz.

Figure 7:
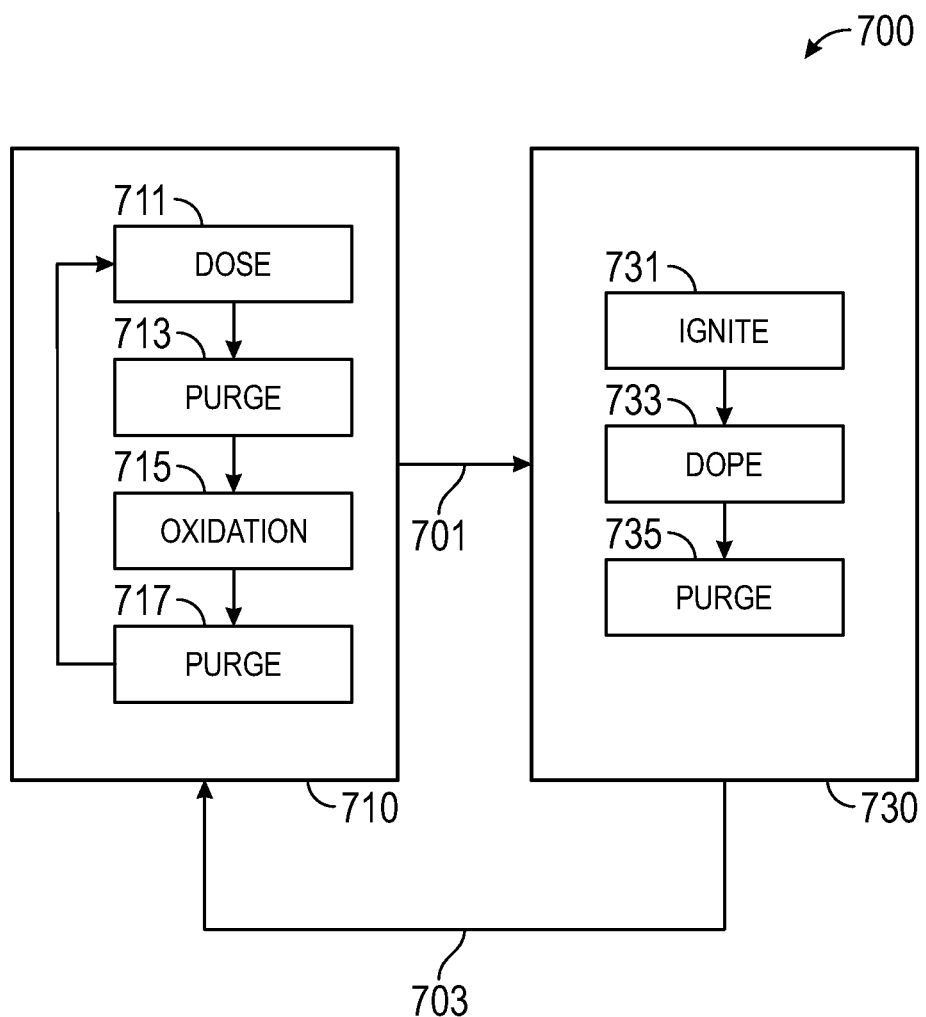
FIG. 7 shows an exemplary embodiment of a method of an ALD process flow for high aspect-ratio (high AR) features and incorporating a dopant process flow.

With reference now to FIG. 7, an exemplary embodiment of a method 700 of an ALD process flow for high aspect-ratio (high AR) features and incorporating a dopant process flow. The exemplary embodiment of the method 700 includes an ALD process flow 710 and a dopant process flow 730. Depending on a particular operation (including required film thicknesses and characteristics, gap-fill capabilities, aspect ratios of features, and other factors understandable to a person of ordinary skill in the art) the ALD process flow 710 may be repeated from 1 to 10 or more times (e.g., n=1 to n≥10 cycles). The dopant process flow 730 may be incorporated within the ALD process flow 710 and within the method 700 in part or in its entirety as needed during the "n" cycles. Further, as is recognizable to a person of ordinary skill in the art, these gases, volumetric flow rates, pressures, and temperatures stated for the method 700 are for a specific exemplary embodiment and may be varied for a particular application.

Referring now to the ALD process flow 710, in a specific exemplary embodiment, at a dose operation 711, a silane precursor gas is introduced to a substrate (e.g., a silicon wafer) in a reactor chamber and includes one or more of the following gases at or near the stated volumetric flow rates: Ar at about 5 slpm and N₂ at about 10 slpm. A pressure within the chamber may be about 3 Torr and a temperature within the chamber may be at about 400° C.

During a purge operation 713, byproducts and excess reactant gases are purged from the reaction chamber. The gases include Ar at about 5 slpm, N₂ at about 10 slpm, O₂ at about 2 slpm, and N₂O at about 5 slpm. A pressure within the chamber may be about 3 Torr and a temperature within the chamber may be at about 400° C.

In an oxidation operation 715, a surface of the substrate is oxidized and cleaned with an RF plasma. The oxidation operation 715 includes one or more of the following gases at or near the stated volumetric flow rates: Ar at about 5 slpm, N₂ at about 10 slpm, O₂ at about 2 slpm, and N₂O at about 5 slpm. A pressure within the chamber may be about 3 Torr and a temperature within the chamber may be at about 400° C. The RF power may be about 5000 W. A frequency of the RF power may be one or more of the aforementioned frequencies or another frequency at which the reactor chamber is configured to operate.

In a second purge operation 717, residual oxidants are purged from the reaction chamber. The gases include Ar at about 5 slpm, N₂ at about 10 slpm, O₂ at about 2 slpm, and N₂O at about 5 slpm. A pressure within the chamber may be about 3 Torr and a temperature within the chamber may be at about 400° C. After completion of the second purge operation 717, the ALD process flow 710 sequence may begin again at the dose operation 711. As noted above, the number of cycles through the ALD process flow 710 may be from n=1 time to n=10 times or more depending on a given operation and desired film characteristics.

The dopant process flow 730 may be introduced at operation 701 at one or more appropriate points in the ALD process flow 710 for a given process and the dopant process flow 730 may return at operation 703 back to the ALD process flow 710. The dopant process flow 730 is shown to include an ignite operation 731, a dope operation 733, and a purge operation 735. In this specific exemplary embodiment, a pressure within the chamber may be about 5 Torr and a temperature within the chamber may be at about 400° C. Further, as is recognizable to a person of ordinary skill in the art, listed gases, volumetric flow rates, pressures, and temperatures stated for the dopant process flow 730 are for a specific exemplary embodiment and may be varied for a particular application.

With continuing reference to the dopant process flow 730, the ignite operation 731 includes one or more of the following gases at or near the stated volumetric flow rates: Ar at about 1 slpm, N₂ at about 8 slpm, O₂ at about 2 slpm, and NF₃ at about 250 sccm. The RF power may be at about 700 W at a frequency of about 13.56 MHz and at about 400 W at a frequency of about 400 kHz.

The dope operation 733 includes one or more of the following gases at or near the stated volumetric flow rates: Ar at about 1 slpm, N₂ at about 8 slpm, O₂ at about 2 slpm, and NF₃ at about 250 sccm. The RF power may be at about 750 W at a frequency of about 13.56 MHz and at about 400 W at a frequency of about 400 kHz. A time period may be determined for a given doping operation but, in this specific exemplary embodiment, may be about 0.5 seconds.

In the purge operation 735, residual gases are purged from the reaction chamber. The gases include Ar at 1 slpm, N₂ at 8 slpm, O₂ at about 2 slpm, NF₃ at about 250 sccm, and other residual gases. The RF power may be about 750 W at a frequency of about 13.56 MHz and at about 400 W at a frequency of about 400 kHz.

Examples of the Disclosed Subject Matter

In a first example, the disclosed subject matter includes a method of forming low dielectric-constant (low-κ) films. The method includes depositing, by atomic-layer deposition (ALD) techniques, a film-deposition layer, doping the deposited film layer with fluorine, depositing, by atomic-layer deposition techniques, a subsequent film-deposition layer, and repeating the deposition operations and the doping operations as needed to obtain a final film thickness of a film having a low dielectric constant.

A second example includes the method of the first example, where the formed low-κ films are silicon-based materials.

A third example includes any one of the preceding examples, and further includes selecting a silane precursor.

A fourth example includes any one of the preceding examples, where the low-κ films comprise at least one material selected from materials including fluorine-doped silicon oxide (SiOF), carbonofluoridoylsilicon (SiOCF), and fluorinated silicon oxynitride (SiONF).

A fifth example includes the fourth example, and further includes selecting a density of the fluorine dopant is within a range of about $1 \times 10^{18}$ atoms per cm³ to about $1 \times 10^{21}$ atoms per cm³.

A sixth example includes either one of the fourth example and the fifth example, where the stated range of the density of the fluorine dopant is within a silicon oxide ($SiO_x$) matrix.

A seventh example includes any one of the preceding examples, and further includes selecting at least one variable from variables comprising a level of fluorine doping and a deposited film thickness per deposition layer.

An eight example includes the seventh example, and further includes selecting the at least one variable such that a resulting formed film has a low dielectric constant in a range of about 3.2 to about 3.4.

In a ninth example, the disclosed subject matter includes a method of forming a low dielectric-constant (low-κ) film. The method includes introducing a silane precursor into a reaction chamber, depositing, by an atomic-layer deposition (ALD) process, at least a first layer of film, oxidizing and cleaning the first layer of film, and doping the first layer of film with a fluorine-based dopant material.

A tenth example includes the method of example nine, and further includes repeating the deposition operations and the doping operations as needed to obtain a final desired film thickness of a film having a low dielectric constant in a range of about 3.2 to about 3.4.

An eleventh example includes any one of the preceding examples, and further includes adding an anneal operation.

A twelfth example includes any one of the preceding examples, and further includes forming the film at least partially within a high-aspect feature thereby providing a substantially void-free gap-fill of the high-aspect ratio feature.

A thirteenth example includes the method of example twelve, and further includes selecting a profile of the fluorine-dopant profile to have a gradient profile in at least one spatial direction.

A fourteenth example includes the thirteenth example, and further includes selecting a profile of the fluorine-dopant profile to have a gradient profile in at least one spatial direction.

In a fifteenth example, the disclosed subject matter includes a method of forming a low dielectric-constant (low-κ) silicon oxide ($SiO_x$) film. The method includes depositing, by atomic-layer deposition (ALD) techniques, a film-deposition layer, doping the deposited film layer with a halide, depositing, by atomic-layer deposition (ALD) techniques, a subsequent film-deposition layer of $SiO_x$, and repeating the deposition operations and the doping operations as needed to obtain a final film thickness of the $SiO_x$ film having a low dielectric constant in a range of about 3.2 to about 3.4.

A sixteenth example includes the fifteenth example, and further includes selecting the halide to comprise at least one material selected from materials including iodine and bromine.

In a seventeenth example, the disclosed subject matter includes a method of forming a low dielectric-constant (low-κ) film. The method includes modulating a film thickness by atomic-layer deposition (ALD) techniques, in a layer-by-layer film-deposition process, doping each deposited film layer with dopant material selected from at least one dopant material comprising fluorine and a halide, depositing, by atomic-layer deposition (ALD) techniques, a subsequent film-deposition layer; and repeating the deposition operations and the doping operations as needed to obtain a final film thickness of the low-κ film.

An eighteenth example includes the seventeenth example, and further includes selecting a type of dielectric material to be deposited.

A nineteenth example includes any one of examples seventeen or eighteen, where the low-κ film comprises at least one material selected from materials including fluorine-doped silicon oxide (SiOF), carbonofluoridoylsilicon (SiOCF), and fluorinated silicon oxynitride (SiONF).

A twentieth example includes any one of examples seventeen through nineteen, where the low-κ film comprises at least one material selected from materials including carbonofluoridoylgermanium (GeOCF) and fluorine-doped germainum oxide (GeOF) materials.

Throughout this specification, plural instances may implement components, operations, chemistries, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, mechanisms, or particular chemistries. In various embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations (e.g., various process recipes) as described herein.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the chemistries, techniques, and examples provided herein may all be applied in various combinations.

Although various embodiments are discussed separately, these separate embodiments are not intended to be considered as independent techniques or designs. As indicated above, each of the various portions may be inter-related and each may be used separately or in combination with other operations or methods described. For example, although various embodiments of methods, operations, chemistries, and processes have been described, these methods, operations, chemistries, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features or methods may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method of forming low dielectric-constant (low-κ) films, the method comprising:
depositing, by atomic-layer deposition (ALD) techniques, a film-deposition layer;
doping the deposited film-deposition layer with fluorine;
depositing, by atomic-layer deposition techniques, a subsequent film-deposition layer;
repeating the deposition operations and the doping operations as needed to obtain a final film thickness of a film having a low dielectric constant; and
selecting at least one variable from variables comprising a level of fluorine doping and a deposited film thickness per deposition layer, such that the resulting formed film has a low dielectric constant in a range of about 3.2 to about 3.4.

2. The method of claim 1, where the formed low-κ films are silicon-based materials.

3. The method of claim 2, further comprising selecting a silane precursor.

4. The method of claim 1, wherein the low-κ films comprise at least one material selected from materials including fluorine-doped silicon oxide (SiOF), carbonofluoridoylsilicon (SiOCF), and fluorinated silicon oxynitride (SiONF).

5. The method of claim 1, further comprising selecting a density of the fluorine dopant is within a range of about $1 \times 10^{18}$ atoms per cm$^3$ to about $1 \times 10^{21}$ atoms per cm$^3$.

6. The method of claim 5, wherein the stated range of the density of the fluorine dopant is within a silicon oxide matrix.

7. A method of forming a low dielectric-constant (low-κ) film, the method comprising:
introducing a silane precursor into a reaction chamber;
depositing, by an atomic-layer deposition (ALD) process, at least a first layer of film;
oxidizing and cleaning the first layer of film;
doping the first layer of film with a fluorine-based dopant material; and
selecting at least one variable from variables comprising a level of fluorine doping and a deposited film thickness per deposition layer, such that the resulting formed film has a low dielectric constant in a range of about 3.2 to about 3.4.

8. The method of claim 7, further comprising repeating the deposition operations and the doping operations as needed to obtain a final desired film thickness of a film having a low dielectric constant in a range of about 3.2 to about 3.4.

9. The method of claim 7, further comprising adding an anneal operation.

10. The method of claim 7, further comprising forming the film at least partially within a high-aspect feature thereby providing a substantially void-free gap-fill of the high-aspect ratio feature.

11. The method of claim 7, further comprising selecting a profile of the fluorine-dopant profile to have a gradient profile in at least one spatial direction.

12. The method of claim 7, further comprising selecting a profile of the fluorine-dopant profile to have a non-gradient profile in at least one spatial direction.

13. A method of forming a low dielectric-constant (low-κ) silicon oxide film, the method comprising:
depositing, by atomic-layer deposition (ALD) techniques, a film-deposition layer;
doping the deposited film-deposition film layer with a halide;
depositing, by atomic-layer deposition (ALD) techniques, a subsequent film-deposition layer of silicon oxide;
selecting at least one variable from variables comprising a level of fluorine doping and a deposited film thickness per deposition layer; and
repeating the deposition operations and the doping operations as needed to obtain a final film thickness of the silicon oxide film having a low dielectric constant in a range of about 3.2 to about 3.4.

14. The method of claim 13, further comprising selecting the halide to comprise at least one material selected from materials including iodine and bromine.

15. A method of forming a low dielectric-constant (low-κ) film, the method comprising:
modulating a film thickness by atomic-layer deposition (ALD) techniques, in a layer-by-layer film-deposition process;
doping each deposited film layer with dopant material selected from at least one dopant material comprising fluorine and a halide;
depositing, by atomic-layer deposition (ALD) techniques, a subsequent film-deposition layer;
repeating the deposition operations and the doping operations as needed to obtain a final film thickness of the low-κ film; and
selecting at least one variable from variables comprising a level of fluorine doping and a deposited film thickness per deposition layer, such that the resulting formed film has a low dielectric constant in a range of about 3.2 to about 3.4.

16. The method of claim 15, further comprising selecting a type of dielectric material to be deposited.

17. The method of claim 15, wherein the low-κ film comprises at least one material selected from materials including fluorine-doped silicon oxide (SiOF), carbonofluoridoylsilicon (SiOCF), and fluorinated silicon oxynitride (SiONF).

18. The method of claim 15, wherein the low-κ film comprises at least one material selected from materials including carbonofluoridoylgermanium (GeOCF) and fluorine-doped germanium oxide (GeOF) materials.

* * * * *